US00RE37960E

(19) United States
(12) Reissued Patent
Cho

(10) Patent Number: US RE37,960 E
(45) **Date of Reissued Patent: *Jan. 7, 2003**

(54) METHOD FOR FORMING AN OXYNITRIDE FILM IN A SEMICONDUCTOR DEVICE

(75) Inventor: Byung-Jin Cho, Kyongki-Do (KR)

(73) Assignee: Hynix Semiconductor, Inc. (KR)

( * ) Notice: This patent is subject to a terminal disclaimer.

(21) Appl. No.: 08/824,879

(22) Filed: Mar. 26, 1997

Related U.S. Patent Documents

Reissue of:
(64) Patent No.: 5,541,141
Issued: Jul. 30, 1996
Appl. No.: 08/394,607
Filed: Feb. 27, 1995

(51) Int. Cl.[7] ..... H01L 21/31

(52) U.S. Cl. ..... 438/770; 438/769

(58) Field of Search ..... 438/769, 770, 438/773, 775; 257/411, 649

(56) References Cited

U.S. PATENT DOCUMENTS

| | | | | | |
|---|---|---|---|---|---|
| 3,422,321 | A | * | 1/1969 | Tombs | 437/241 |
| 4,363,868 | A | * | 12/1982 | Takasaki et al. | 430/314 |
| 4,438,157 | A | * | 3/1984 | Romano-Moran | 427/93 |
| 4,532,022 | A | * | 7/1985 | Takasaki et al. | 257/323 |
| 4,543,707 | A | * | 10/1985 | Ito et al. | 148/DIG. 161 |
| 4,581,622 | A | * | 4/1986 | Takasaki et al. | 148/DIG. 114 |
| 4,960,727 | A | * | 10/1990 | Mattox et al. | 257/506 |
| 5,264,396 | A | * | 11/1993 | Thakur et al. | 438/695 |
| 5,296,411 | A | * | 3/1994 | Gardner et al. | 438/264 |
| 5,338,954 | A | * | 8/1994 | Shimoji | 257/326 |
| 5,397,720 | A | * | 3/1995 | Kwong et al. | 438/301 |
| 5,403,786 | A | * | 4/1995 | Hori | 438/585 |
| 5,631,199 | A | * | 5/1997 | Park | 438/770 |

OTHER PUBLICATIONS

Yoon et al., "MOS characteristic of NH3 nitrided N2O grown oxides", IEEE Electron Device Letters, vol. 14, No. 4, Apr. 1993.*

Arakawa, T. et al., "Effect of NH3 nitridation on time–dependent dielectric breaddown characteristics of heavily oxynitride tunnel oxide films", Electronics Letters, vol. 30, No. 4, Feb. 17, 1994.*

S. Wolf and R. N. Tauber, *Silicon Processing for the VLSI Era, Volume I, Process Technology,* Lattice Press (eds.). See Chapter 6, "Chemical Vapor Deposition of Amorphous and Polycrystalline Thin Films," specifically p. 195, "Silicon Oxynitrides" (1986).

* cited by examiner

*Primary Examiner*—Michael J. Sherry
*Assistant Examiner*—Lisa Kilday
(74) *Attorney, Agent, or Firm*—Townsend and Townsend and Crew LLP

(57) ABSTRACT

A method for forming an oxide film in a semiconductor device comprises a pre-oxidation process, a main oxidation process and a post-oxidation process. $N_2O$ gas is used for the pre-oxidation process, a mixed gas of $N_2O$ gas and $NH_3$ gas is used for the main oxidation process, and $N_2O$ gas is used for the post-oxidation process. The insulation characteristics of the oxide film are increased by introducing nitrogen, and amount of introduced nitrogen can be regulated by the controlling of amount of $NH_3$ gas. Also, the problems encountered when $NH_3$ gas and $N_2O$ gas are used separately for the oxidation process can be solved by using of the mixed gas of $NH_3$ gas and $N_2O$ gas.

40 Claims, 1 Drawing Sheet

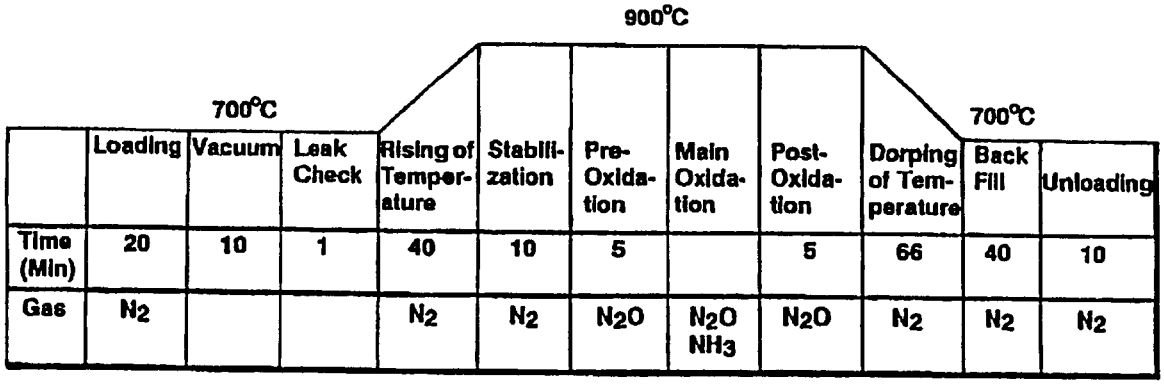

700°C

900°C

700°C

| | Loading | Vacuum | Leak Check | Rising of Temperature | Stabilization | Pre-Oxidation | Main Oxidation | Post-Oxidation | Dorping of Temperature | Back Fill | Unloading |
|---|---|---|---|---|---|---|---|---|---|---|---|
| Time (Min) | 20 | 10 | 1 | 40 | 10 | 5 | | 5 | 66 | 40 | 10 |
| Gas | $N_2$ | | | $N_2$ | $N_2$ | $N_2O$ | $N_2O$ $NH_3$ | $N_2O$ | $N_2$ | $N_2$ | $N_2$ |

METHOD FOR FORMING AN OXYNITRIDE FILM IN A SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method for forming an oxide film in a semiconductor device, more particularly to a method for forming an oxide film, which can obtain an oxide film of good quality by growing an oxide film under environment of mixed gas of $N_2O$ gas and $NH_3$ gas during a main oxidation process and by using $N_2O$ gas during a pre-oxidation process and a post-oxidation process.

2. Information Disclosure Statement

In general, in order to enhance the reliability of oxide film in a semiconductor device, nitrogen is introduced in an oxide film. In the method for forming an oxide film using $NH_3$ gas, the long-term reliability of the oxide film is deteriorated due to hydrogen ions contained in $NH_3$ gas. There is another method for forming an oxide film using $N_2O$ gas, however, an high temperature process is required because of the high activation energy of $N_2O$ gas. Also it is impossible to control independently the oxidation rate and influx of the nitrogen. That is, $N_2O$ gas is resolved into 64.3% of $N_2$, 31.0% of $O_2$ gas and 4.7% of NO gas in the oxidation chamber under a temperature of 950 degree Celsius. The NO gas is needed to introduce nitrogen into the oxide film, however, NO gas exists in extremely small quantities of 4.7%. Also, most of the NO gas acts upon the $O_2$ gas, and $NO_2$ gas is formed according to the chemical reaction formula: ($2NO+O_2=2NO_2$). Therefore, because the influx of nitrogen depends on the degree of reaction of NO gas and $O_2$ gas, it is impossible to control independently the oxidation rate and influx of the nitrogen.

SUMMARY OF THE INVENTION

It is an object of the present invention to provide a method for forming an oxide film using $N_2O$ gas, and mixed gas of $N_2O$ gas and $NH_3$ gas, so that it is possible to control the oxidation rate and influx of the nitrogen and obtain an oxide film of good quality.

To achieve the above object, a method for forming an oxide film comprises the steps of:

a) initiating oxide film formation by introducing an NITROUS OXIDE containing gas;

b) controlling the oxidation rate and influx of nitrogen by introducing ammonia into the nitrous oxide containing gas; and c) halting the introducing of ammonia gas while maintaining the flow of nitrous oxide containing gas until formation of the oxide film is complete.

BRIEF DESCRIPTION OF THE DRAWINGS

The present invention will now be described with reference to the attached drawings, in which:

The FIGURE is a flow chart illustrating the method of oxidation according to the present invention.

A more complete understanding of the present invention can be obtained by considering the following detailed description.

DETAILED DESCRIPTION OF THE INVENTION

A method for forming an oxide film according to the present invention is described in detail conjunction with the FIGURE.

A wafer is loaded in an oxidation chamber containing $N_2$ gas at a temperature of 700 degree Celsius. Temperature in the oxidation chamber is increased to 900 degree Celsius and then stabilized. Then a pre-oxidation process, main oxidation process and post-oxidation process are executed successively in the oxidation chamber in order to form an oxide film on the surface of the wafer.

The pre-oxidation process is executed with $N_2O$ gas, the main oxidation process is performed with a mixed gas of $N_2O$ gas and $NH_3$ gas, and the post-oxidation process is done with $N_2O$ gas.

Thereafter, the temperature of interior of the oxidation chamber is dropped to 700 degree Celsius, and $N_2$ gas is supplied in the oxidation chamber. The oxidation process is completed, and the wafer is unloaded from the oxidation chamber.

In the above oxidation processes, temperature in the oxidation chamber, pressure and flow rate of process gases ($N_2O$ gas and $NH_3$ gas) are varied according to the condition (thickness) of the oxide film.

As noted, prior to and after the main oxidation process using the mixed gas of $N_2O$ gas and $NH_3$ gas, the pre-oxidation and post-oxidation processes using $N_2O$ gas are performed. The post-oxidation process is undertaken so as to prevent a nitridation of the surface of the wafer. The post-oxidation process is done to prevent penetration of any remaining $NH_3$ to the oxide film and to prevent degeneration of the interface characteristic by hydrogen.

In the main oxidation process, $NH_3$ gas is mixed with $N_2O$ gas, the proper ratio of $NH_3$ gas in the mixed gas is 0.5–20%. Because of the lower activation energy of $NH_3$ gas, the influx of nitrogen depends upon amount of $NH_3$ gas. Therefore, enough nitrogen can be introduced in the oxide film by the mixed gas of a small quantity of $NH_3$ gas and N2 O, and the incorporated amount of nitrogen can be controlled by a rate of $NH_3$ gas. Also, hydrogen is acted upon oxygen which is resolved into $N_2O$ gas, and then is made OH as a wet oxidizer, OH accelerates the oxidation process.

Because nitrogen is incorporated into the oxide film simultaneously with the oxidation process, it therefore is possible to obtain .an oxide film of good quality.

According to the present invention as described above, the insulation characteristics of an oxide film is increased by an introducing nitrogen, the amount of nitrogen can be regulated by controlling of the amount of $NH_3$ gas. Also, the present invention can solve the problems encountered when $NH_3$ gas and $N_2O$ gas are used separately for the oxidation process, by using of the mixed gas of $NH_3$ gas and $N_2O$ gas.

What is claimed is:

1. A method for forming an oxide film in a semiconductor device comprising:

a) initiating oxide film formation by introducing an nitrous oxide containing gas;

b) controlling the oxidation rate and influx of nitrogen by introducing ammonia into said nitrous oxide containing gas; and c) halting the introducing of ammonia gas while maintaining the flow of nitrous oxide containing gas until formation of said oxide film is complete.

*2. The method of claim 1 further comprising the steps of:*

*prior to said initiating oxide film formation step, loading the semiconductor device into an oxidation chamber; and*

*introducing a nitrogen containing gas into said oxidation chamber.*

*3. The method of claim 2 further comprising the step of increasing a temperature in said oxidation chamber from a first temperature to a second temperature during said introducing nitrogen containing gas step.*

*4. The method of claim 3 wherein said first temperature is 700 degrees Celsius.*

*5. The method of claim 3 wherein said second temperature is 900 degrees Celsius.*

*6. The method of claim 1 further comprising the steps of:*

*supplying a nitrogen containing gas to an oxidation chamber containing said semiconductor device after said halting step; and*

*reducing a temperature in said oxidation chamber.*

*7. The method of claim 1 wherein said initiating step is a pre-oxidation process.*

*8. The method of claim 1 wherein said controlling step is a main oxidation process.*

*9. The method of claim 1 wherein said halting step is a post-oxidation process.*

*10. The method of claim 9 wherein said post-oxidation process prevents a possibility of nitridation in a substrate of said semiconductor device.*

*11. The method of claim 9 wherein said post-oxidation process prevents a possibility of said ammonia penetrating said oxide film after said halting step.*

*12. The method of claim 9 wherein said post-oxidation process prevents a possibility of degeneration of said oxide film by hydrogen ions in said ammonia.*

*13. The method of claim 1 wherein during said controlling step, said ammonia and said nitrous oxide in said nitrous oxide containing gas are provided at a ratio which ranges between 0.5% and 20%.*

*14. The method of claim 1 wherein said controlling step produces an OH.*

*15. The method of claim 14 wherein said OH accelerates said oxide film formation.*

*16. The method of claim 1 wherein said controlling step is provided at a temperature of 900 degrees Celsius.*

*17. A method for forming an oxide film in a semiconductor device comprising the steps of:*

*introducing a nitrous oxide containing gas to the semiconductor device to initiate the film formation;*

*after introducing said nitrous oxide containing gas, mixing an ammonia containing compound with said nitrous oxide containing gas to control an oxidation rate and influx of nitrogen; and*

*halting the introduction of said ammonia containing compound while maintaining a flow of the nitrous oxide containing gas until formation of said oxide film is complete.*

*18. The method of claim 17 further comprising the step of maintaining a flow rate of said nitrous oxide during said halting step until said film formation is complete.*

*19. The method of claim 17 further comprising the steps of:*

*prior to said introducing step, loading a wafer into an oxidation chamber; and*

*introducing a nitrogen containing gas into said oxidation chamber.*

*20. The method of claim 19 further comprising the step of:*

*raising a temperature in said oxidation chamber during said introducing nitrogen containing gas step from a first temperature to a second temperature.*

*21. The method of claim 20 wherein said first temperature is 700 degrees Celsius.*

*22. The method of claim 20 wherein said second temperature is 900 degrees Celsius.*

*23. The method of claim 17 further comprising the steps of:*

*supplying a nitrogen containing gas after said halting step to an oxidation chamber containing the semiconductor device; and*

*dropping a temperature in said oxidation chamber.*

*24. The method of claim 17 wherein said introducing a nitrous oxide containing gas is a pre-oxidation process.*

*25. The method of claim 17 wherein said mixing step is a main oxidation process.*

*26. The method of claim 17 wherein said halting step is a post-oxidation process.*

*27. The method of claim 26 wherein said post-oxidation process prevents a possibility of nitridation in a substrate of said semiconductor device.*

*28. The method of claim 26 wherein said post-oxidation process prevents a possibility of said ammonia in said ammonia containing compound penetrating said film after said halting step.*

*29. The method of claim 17 wherein during said mixing step, said ammonia in said ammonia containing compound and said nitrous oxide in said nitrous oxide containing gas is at a ratio which ranges from 0.5% to 20%.*

*30. The method of claim 17 wherein said mixing step is performed at 900 degrees Celsius.*

*31. The method of claim 17 wherein said OH accelerates said film formation.*

*32. A method for forming an oxide film on a semiconductor device comprising the steps of:*

*loading the semiconductor device into an oxidation chamber containing a nitrogen containing gas;*

*increasing a temperature of said oxidation chamber from a first temperature to a second temperature;*

*introducing a nitrous oxide containing gas into said oxidation chamber to initiate the film formation; said introducing step being a pre-oxidation process;*

*after introducing said nitrous oxide containing gas into said oxidation chamber, mixing an ammonia containing compound with said nitrous oxide containing gas to control an oxidation rate and influx of nitrogen, said mixing step being a main oxidation process;*

*halting the introduction of said ammonia containing compound while maintaining a flow of the nitrous oxide containing gas until formation of said oxide film is complete, said halting step being a post-oxidation process;*

*dropping a temperature in said oxidation chamber; and*

*supplying a nitrogen containing gas to said oxidation chamber.*

*33. The method of claim 32 wherein during said halting step, a flow rate of said nitrous oxide containing gas is maintained after the halting of said ammonia until said film formation is completed.*

*34. The method of claim 32 wherein said first temperature is 700 degrees Celsius.*

*35. The method of claim 32 wherein said second temperature is 900 degrees Celsius.*

*36. The method of claim 32 wherein said post-oxidation process prevents a possibility of said ammonia penetrating said film after said main oxidation process.*

*37. The method of claim 32 wherein during said mixing step, said ammonia in said ammonia containing compound and said nitrous oxide in said nitrous oxide containing gas is at a ratio which ranges from 0.5% to 20%.*

*38. The method of claim 32 wherein during said mixing step produces an OH.*

*39. The method of claim 38 wherein said OH accelerates said film formation.*

*40. The method of claim 32 wherein said mixing step is performed at 900 degrees Celsius.*

* * * * *